US012581987B2

(12) United States Patent
Shen et al.

(10) Patent No.: US 12,581,987 B2
(45) Date of Patent: Mar. 17, 2026

(54) REDISTRIBUTION LAYERS AND METHODS OF FABRICATING THE SAME IN SEMICONDUCTOR DEVICES

(71) Applicant: Taiwan Semiconductor Manufacturing Co., Ltd., Hsin-Chu (TW)

(72) Inventors: Hsiang-Ku Shen, Hsinchu (TW); Dian-Hau Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/641,836

(22) Filed: Apr. 22, 2024

(65) Prior Publication Data

US 2024/0274558 A1     Aug. 15, 2024

Related U.S. Application Data

(63) Continuation of application No. 18/166,960, filed on Feb. 9, 2023, now Pat. No. 11,967,573, which is a continuation of application No. 16/941,308, filed on Jul. 28, 2020, now Pat. No. 11,581,276.

(60) Provisional application No. 62/907,563, filed on Sep. 28, 2019.

(51) Int. Cl.
H01L 23/00 (2006.01)

(52) U.S. Cl.
CPC .............. H01L 24/05 (2013.01); H01L 24/13 (2013.01); *H01L 2224/02311* (2013.01); *H01L 2224/02313* (2013.01); *H01L 2224/02333*

(2013.01); *H01L 2224/0235* (2013.01); *H01L 2224/02381* (2013.01); *H01L 2224/0239* (2013.01); *H01L 2224/0401* (2013.01); *H01L 2224/05647* (2013.01); *H01L 2224/10126* (2013.01); *H01L 2224/13024* (2013.01); *H01L 2224/1357* (2013.01)

(58) Field of Classification Search
CPC ....................................................... H01L 24/05
See application file for complete search history.

(56) References Cited

U.S. PATENT DOCUMENTS

| | | | |
|---|---|---|---|
| 8,823,166 B2 | 9/2014 | Lin et al. | |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |

(Continued)

FOREIGN PATENT DOCUMENTS

| | | |
|---|---|---|
| CN | 101083301 A | 12/2007 |
| CN | 103633059 A | 3/2014 |

(Continued)

*Primary Examiner* — William A Harriston
(74) *Attorney, Agent, or Firm* — Haynes and Boone, LLP

(57) ABSTRACT

A semiconductor structure includes a first dielectric layer over a metal line and a redistribution layer (RDL) over the first dielectric layer. The RDL is electrically connected to the metal line. The RDL has a curved top surface and a footing feature, where the footing feature extends laterally from a side surface of the RDL. A second dielectric layer is disposed over the RDL, where the second dielectric layer also has a curved top surface.

20 Claims, 11 Drawing Sheets

(56)　　　　　　References Cited

U.S. PATENT DOCUMENTS

| | | | |
|---|---|---|---|
| 9,281,254 | B2 | 3/2016 | Yu et al. |
| 9,324,671 | B2 * | 4/2016 | Zhang ..................... H01L 24/13 |
| 9,368,460 | B2 | 6/2016 | Yu et al. |
| 9,372,206 | B2 | 6/2016 | Wu et al. |
| 9,496,189 | B2 | 11/2016 | Yu et al. |
| 2005/0277281 | A1 * | 12/2005 | Dubin ..................... H01L 24/13 |
| | | | 438/618 |
| 2007/0108612 | A1 | 5/2007 | Hsieh et al. |
| 2007/0120269 | A1 | 5/2007 | Hsieh et al. |
| 2011/0223765 | A1 | 9/2011 | Rajagopalan et al. |
| 2012/0319282 | A1 * | 12/2012 | Uzoh ................ H01L 23/53238 |
| | | | 438/618 |
| 2014/0061900 | A1 | 3/2014 | Park et al. |
| 2014/0264841 | A1 * | 9/2014 | Lin .......................... H01L 24/16 |
| | | | 257/737 |
| 2015/0279795 | A1 * | 10/2015 | Zhang ..................... H01L 24/13 |
| | | | 257/738 |
| 2018/0061787 | A1 | 3/2018 | Wu |

FOREIGN PATENT DOCUMENTS

| | | | |
|---|---|---|---|
| CN | 104051384 | A | 9/2014 |
| CN | 104733333 | A | 6/2015 |
| CN | 106057767 | A | 10/2016 |
| JP | 2011253994 | A | 12/2011 |
| TW | 483105 | B | 4/2002 |
| TW | 201128749 | A | 8/2011 |
| TW | 201923866 | A | 6/2019 |

* cited by examiner

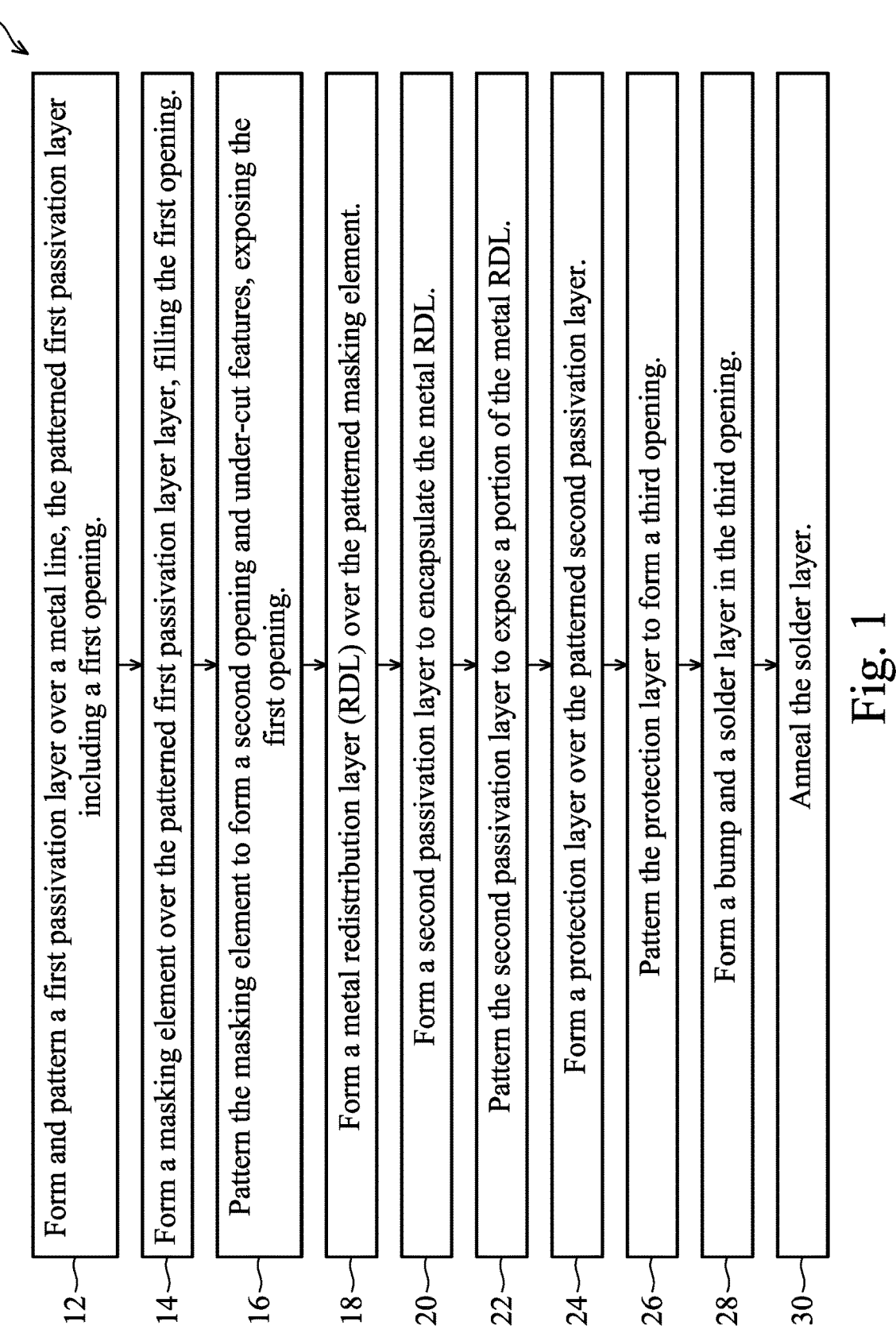

10

12 — Form and pattern a first passivation layer over a metal line, the patterned first passivation layer including a first opening.

14 — Form a masking element over the patterned first passivation layer layer, filling the first opening.

16 — Pattern the masking element to form a second opening and under-cut features, exposing the first opening.

18 — Form a metal redistribution layer (RDL) over the patterned masking element.

20 — Form a second passivation layer to encapsulate the metal RDL.

22 — Pattern the second passivation layer to expose a portion of the metal RDL.

24 — Form a protection layer over the patterned second passivation layer.

26 — Pattern the protection layer to form a third opening.

28 — Form a bump and a solder layer in the third opening.

30 — Anneal the solder layer.

Fig. 1

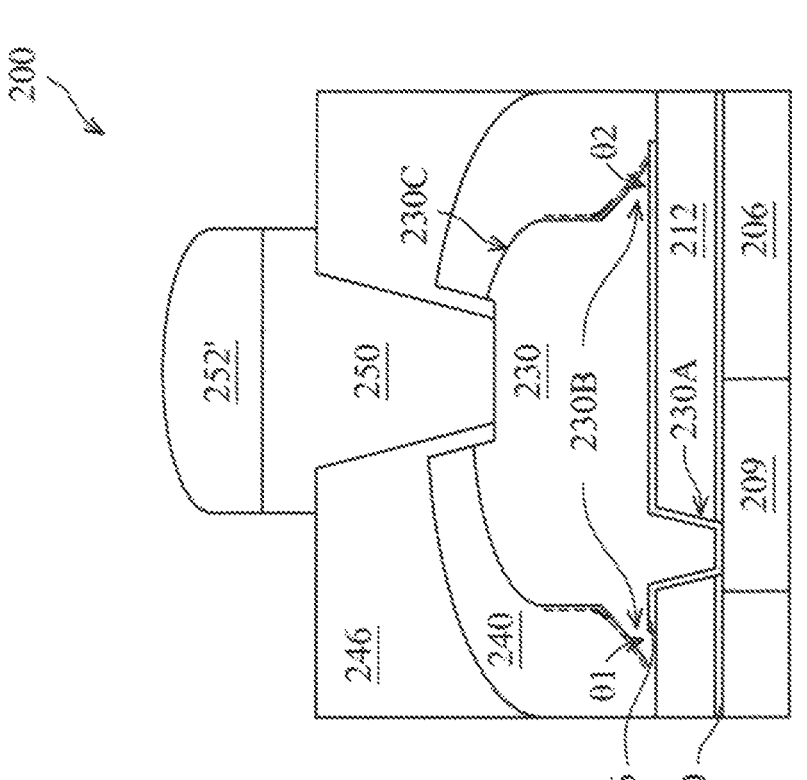
Fig. 14A
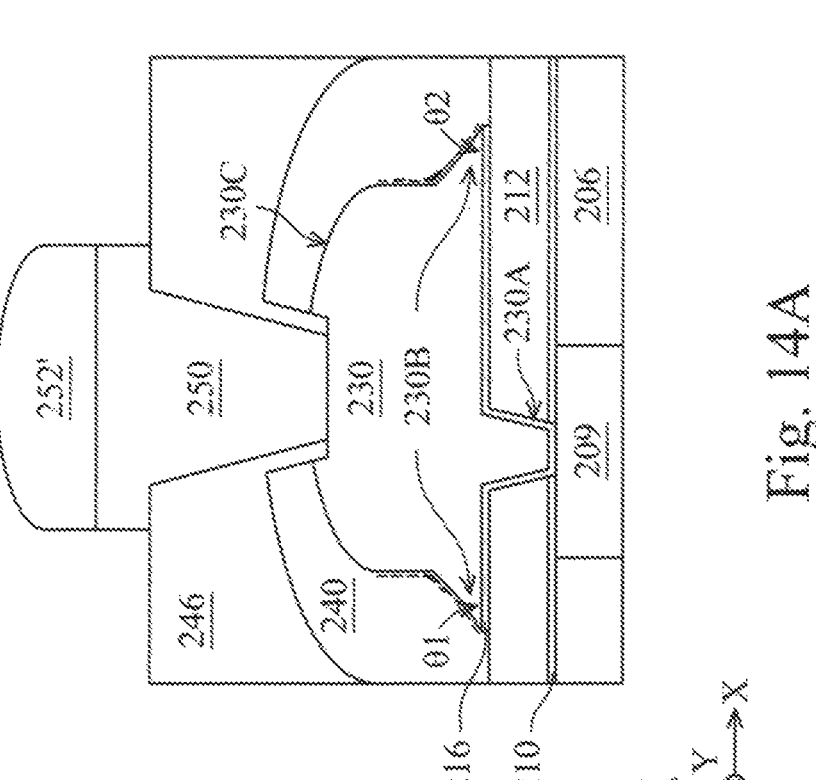
Fig. 14B

REDISTRIBUTION LAYERS AND METHODS OF FABRICATING THE SAME IN SEMICONDUCTOR DEVICES

CROSS-REFERENCE TO RELATED APPLICATIONS

This is a continuation application of U.S. application Ser. No. 18/166,960, filed Feb. 9, 2023, which is a continuation application of U.S. patent application Ser. No. 16/941,308, filed Jul. 28, 2020, which claims priority to U.S. Provisional Patent Application Ser. No. 62/907,563, filed Sep. 28, 2019, each of which is herein incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

For example, ICs are formed on a semiconductor substrate that may be cut into individual device dies or IC chips. Each IC chip may be further attached (such as by bonding) to an interposer, a reconstituted wafer, a circuit board, or another die to form a package or a device. To meet various routing needs, a redistribution layer (RDL) of conductive metal lines may be formed on an IC chip to reroute bond connections from the edge to the center of the chip, or generally to disperse bond connections to an area greater than that of the IC chip. One or more passivation layers have been implemented around the RDL to protect the semiconductor surface from electrical shorts, stress, and chemical contaminants. However, some passivation layers are prone to stress and cracks during subsequent processes and may lead to voids or cracks at interfaces with adjacent metal contacts. Therefore, although existing methods of fabricating RDL have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 1 is a flow chart of a method for fabricating a semiconductor device in accordance with embodiments of the present disclosure.

FIGS. 2, 3, 4, 5A, 5B, 5C, 6A, 6B, 6C, 6D, 7A, 7B, 8, 9, 10, 11, 12, 13, 14A, and 14B are cross-sectional views of a workpiece at various stages of an embodiment of the method depicted in FIG. 1 according to embodiments of the present disclosure.

DETAILED DESCRIPTION

Figures 2, 3, 4:
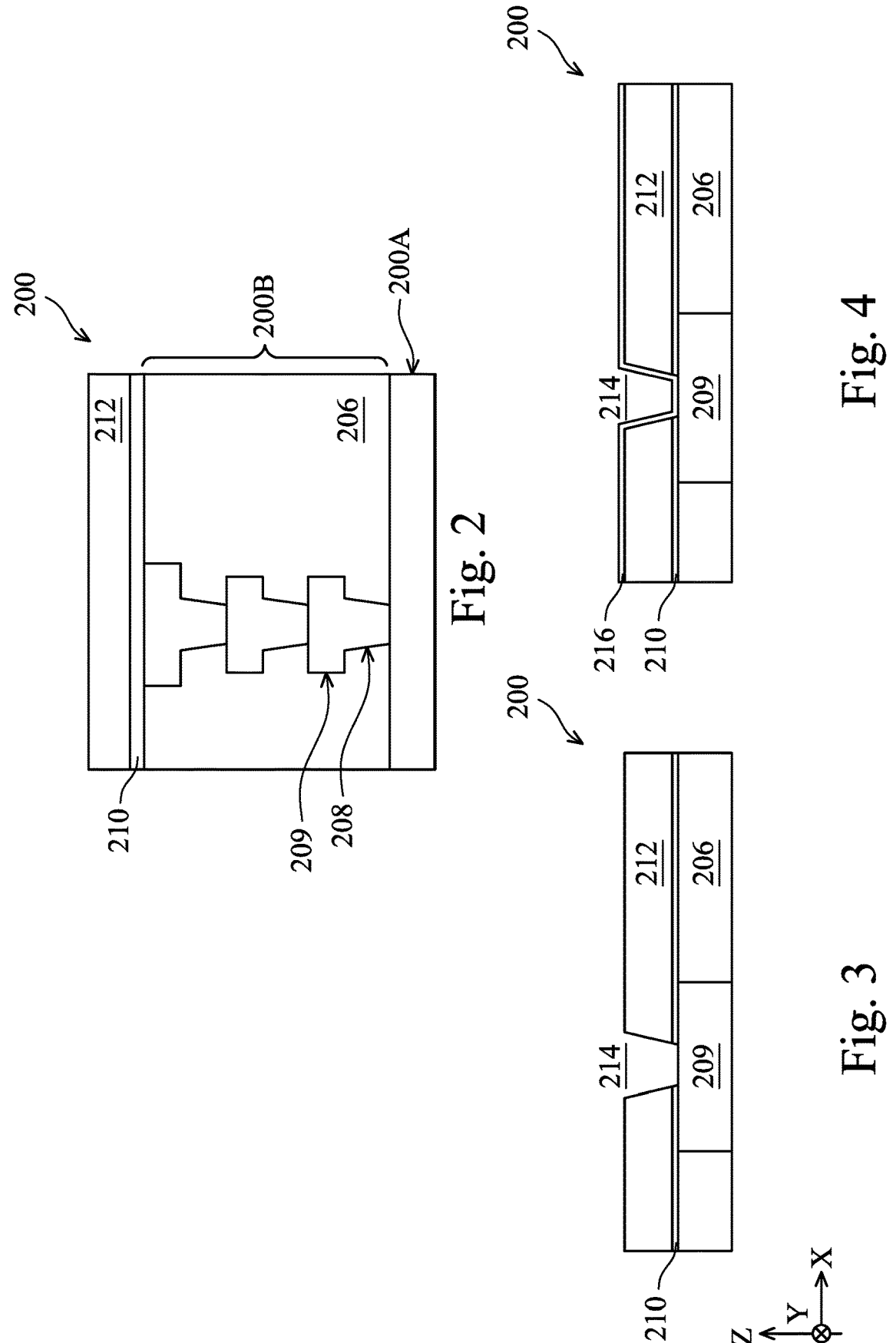

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/-10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

On many IC chips, a conductive (i.e., metal-containing) redistribution layer (RDL) of conductive metal lines is formed to reroute bond connections from an edge to a center of the chip or generally to distribute bond connections to an area larger than that of the IC chip. One or more passivation layers, which may include one or more dielectric materials, may be formed around the RDL to protect the semiconductor surface from electrical shorts, mechanical stresses, and/or chemical contaminants. In some instances, a polymeric protection layer is formed over the one or more passivation layers. Due to volumetric shrinkage of the polymeric protection layer as a result of curing and mismatch in coefficient of thermal expansion (CTE) between the polymeric protection layer, the one or more of the passivation layers, and the RDL, stress may be concentrated at corners of the RDL that are in contact with the one or more of the passivation layers. Such concentrated stress may propagate through the one or more passivation layers, causing cracks in and/or delamination of the one or more passivation layers from the RDL. For at least these reasons, improvements in methods of forming RDL are desired.

The various aspects of the present disclosure will now be described in more detail with reference to the figures. In that regard, FIG. 1 is a flowchart illustrating a method 10 for fabricating a semiconductor device according to embodiments of the present disclosure. The method 10 is merely an example and is not intended to limit the present disclosure to what is explicitly illustrated in the method 10. Additional steps can be provided before, during, and after the method 10, and some steps described can be replaced, eliminated, or moved around for additional embodiments of the method. Not all steps are described herein in detail for reasons of simplicity. The method 10 is described below in conjunction with FIGS. 2-14B, which are diagrammatic fragmentary cross-sectional views of a workpiece 200 at different stages of an embodiment of the method 10 according to embodiments of the present disclosure.

Referring to FIGS. 1 and 2, the method 10 at block 12 forms a workpiece 200 that includes a substrate 200A, an interconnect structure 200B over the substrate 200A, an etch stop layer (ESL) 210 over the interconnect structure 200B, and a first passivation layer 212. In some embodiments, the substrate 200A may be made of silicon or other semiconductor materials such as germanium. In some other embodiments, the substrate 200A may include a compound semiconductor such as silicon carbide, gallium arsenic, indium arsenide, or indium phosphide. In still other embodiments, the substrate 200A may include an alloy semiconductor such as silicon germanium, silicon germanium carbide, gallium arsenic phosphide, or gallium indium phosphide. Additionally or alternatively, the substrate 200A may include an epitaxial layer (not depicted) overlying a bulk semiconductor (not depicted). Though not depicted, various microelectronic components may be formed in or on the substrate 200A, such as transistor components including source/drain features and/or gate structures, isolation structures including shallow trench isolation (STI), passive components, and/or or any other suitable components.

The interconnect structure 200B formed over the substrate 200A may be a multi-layered interconnect (MLI) structure and may include contact vias 208, conductive lines 209 embedded in multiple inter-metal dielectric (IMD) layers, which are collectively depicted as IMD layer 206 in FIG. 2 as an example. In some examples, each of the contact vias 208 and the conductive lines 209 is embedded in a separate IMD layer 206. In other examples, a contact via 208 and a conductive line 209 may be formed together in an IMD layer. Conductive lines at the same level may be collectively referred to as a metal layer and different metal layers are interconnected by one or more contact vias 208. The interconnect structure 200B is configured to provide interconnections (e.g., wiring) between the various microelectronic components that have been or will be formed on the workpiece 200. There may be intermediate layers or components disposed between the interconnect structure 200B and the substrate 200A, but in the interest of simplicity such layers or components are not shown. The IMD layer 206 may include silicon oxide or a low-k dielectric material whose dielectric constants are less than that of silicon dioxide, which is about 3.9. In some embodiments, the low-k dielectric materials include a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), hydrogen silsesquioxane (HSQ), methylsilsesquioxane (MSQ), or combinations thereof. The IMD layer 206 may further include one or more ESL disposed between the contact vias 208 and the conductive lines 209 (i.e., between IMD layers 206).

The contact vias 208 and conductive lines 209 are formed in the IMD layers 206. Each contact via 208 and the conductive line 209 may be formed separately by single damascene processes and/or collectively by dual damascene processes. In a single damascene process, a trench for forming a conductive line 209 (or a via opening for forming a contact via 208) is first formed in one of the IMD layers 206, followed by filling the trench (or the via opening) with a conductive layer. A planarization process such as a chemical-mechanical polishing or planarization (CMP) process is then performed to remove the excess portions of the conductive layer formed over the top surface of the IMD layer 206, leaving the conductive line 209 (or the contact via 208) in the trench (or the via opening). In some embodiments, if the contact via 208 and the conductive line 209 disposed thereover are formed separately using single damascene processes, conductive layers of different compositions may be deposited to form the features. In a dual damascene process, a trench and a via opening are formed together in an IMD layer, with the via opening disposed below and connected to the trench. The conductive layer is then deposited in the trench and the via opening in a single deposition process to form the conductive line 209 over the contact via 208. The conductive layer may include copper, tungsten, aluminum, cobalt, ruthenium, gold, other suitable metals, their respective alloys, or combinations thereof, and may be deposited by any suitable method, such as chemical vapor deposition (CVD), plating (e.g., electroplating, electroless plating, etc.) other suitable methods, or combinations thereof. In some embodiments, the conductive layer includes copper in the form of, for example, elemental copper, cupronickel, a copper-aluminum alloy, other copper-containing alloys, or combinations thereof. In some embodiments, though not depicted, the contact vias 208 and/or the conductive lines 209 each includes the conductive layer disposed over a barrier layer. The barrier layer may include titanium, titanium nitride, tantalum, tantalum nitride, tungsten, cobalt, cobalt nitride, tungsten nitride, ruthenium, ruthenium nitride, other suitable metals, other suitable metal nitrides, or combinations thereof. For embodiments in which the conductive layer includes copper (or any alloy thereof), the contact vias 208 and/or the conductive lines 209 may further include a copper-containing seed layer over which the conductive layer is deposited.

The workpiece 200 also includes the ESL 210 and the first passivation layer 212 formed over the interconnect structure 200B. The ESL 210 may include silicon carbon nitride (SiCN), silicon oxycarbide (SiOCN), silicon oxycarbide (SiOC), silicon carbide (SiC), silicon nitride (SiN), or combinations thereof, and may be formed over the interconnect structure 200B by a suitable method such as atomic layer deposition (ALD) and/or CVD. The first passivation layer 212 may be a single layer or a composite layer formed over the ESL 210 by any suitable method such as spin-on-glass (SOG) and/or other suitable methods. The first passivation layer 212 may be formed of a non-porous material. In the present embodiments, the first passivation layer 212 is a single layer including un-doped silicate glass (USG). The following description is directed to methods of forming an RDL over the ESL 210 and the first passivation layer 212 to electrically connect with a topmost conductive line 209 of the interconnect structure 200B. Accordingly, for purposes of simplicity, the intermediate stages of the method 10 will be discussed with reference to such portions of the workpiece 200 as illustrated in subsequent FIGS. 3-14B.

Referring now to FIGS. 1 and 3, the method 10 at block 12 patterns the first passivation layer 212 and the ESL 210 to form an opening 214 that exposes a portion of the conductive line 209. The opening 214 may be formed by a series of patterning and etching processes including, for example, forming a masking element (not depicted) over the first passivation layer 212, exposing the masking element that includes a photoresist layer through a photomask, developing the exposed masking element in a suitable solvent (i.e., developer) to form a patterned masking element including an opening, etching through the first passivation layer 212 and the ESL 210 exposed in the opening, and removing the patterned masking element from the workpiece 200 by a suitable method such as resist stripping, wet etching, and/or plasma ashing.

Referring to FIG. 4, the method 10 at block 12 subsequently forms a seed layer 216 over the patterned first passivation layer 212, such that the seed layer 216 lines a bottom and sidewall surfaces of the opening 214. The seed layer 216 may include copper, tantalum, titanium, titanium nitride, tantalum nitride, other suitable materials, or combinations thereof. The seed layer 216 may be a single metal layer or alternatively a composite layer. In the present embodiments, the seed layer 216 includes copper, such that it is configured to facilitate subsequent formation of a copper-containing RDL thereover. The seed layer 216 may be deposited by any suitable method, such as CVD, ALD, physical vapor deposition (PVD), or other suitable methods. Though not depicted, a barrier layer may be formed between the seed layer 216 and the patterned first passivation layer 212. The composition and methods of forming such a barrier layer are similar to those discussed above with respect to the contact vias 208 and the conductive lines 209. In the present embodiments, the seed layer 216 is configured to provide a substrate for forming the RDL thereover using a plating method, such as electroplating, the process of which is discussed in detail below.

Figures 5A, 5B, 5C:
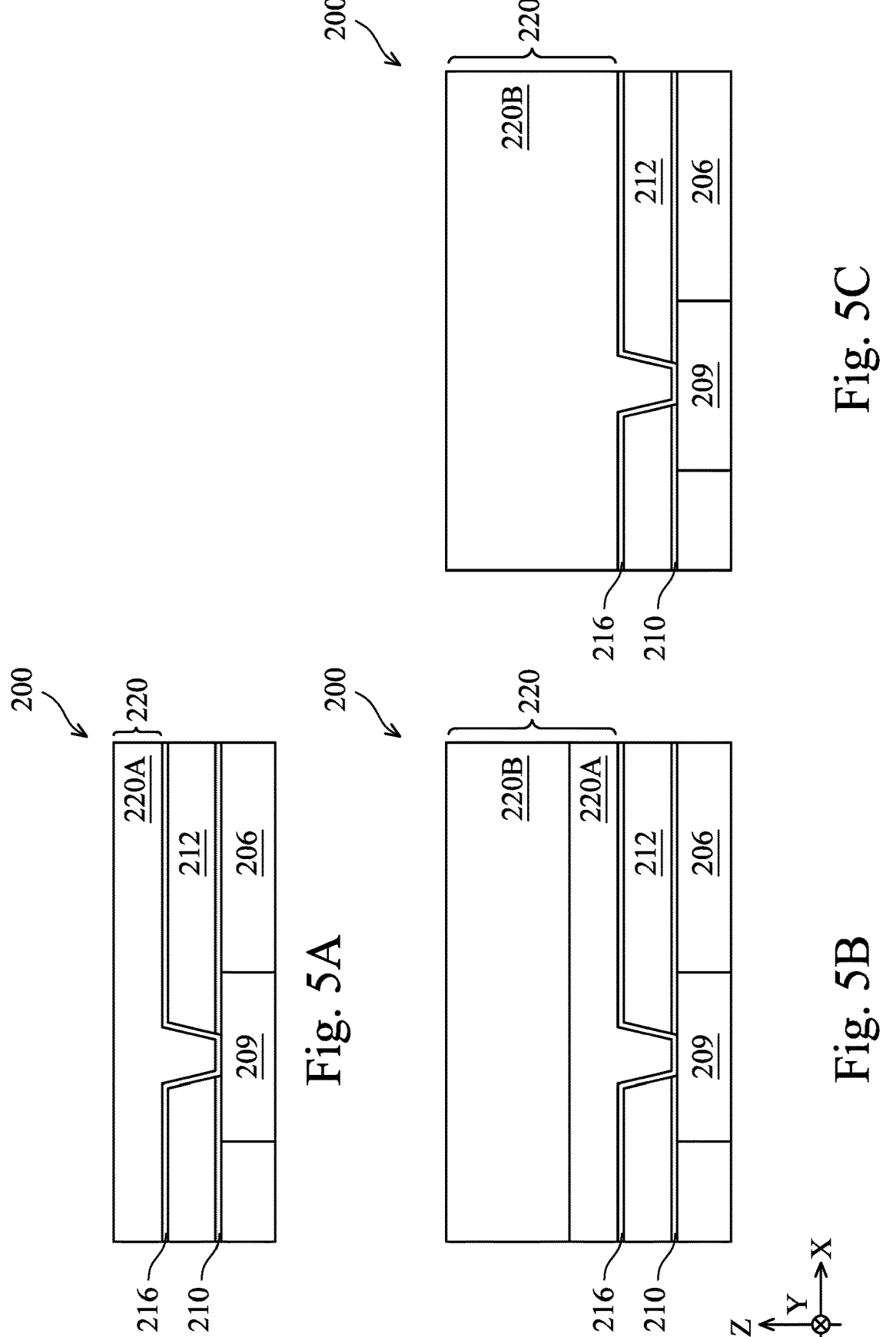

Now referring to FIGS. 1 and 5A-5C, the method 10 at block 14 forms a masking element 220 over the seed layer 216, thereby filling the opening 214. The masking element 220 may be multi-layered as depicted in FIGS. 5A and 5B or, alternatively, single-layered as depicted in FIG. 5C. Although both structures are equally applicable in the present embodiments, they provide different pathways for forming the RDL as will be discussed in detail below.

Referring to FIG. 5A, the method 10 at block 14 first forms a bottom layer 220A over the seed layer 216, thereby filling the opening 214. In the present embodiments, the bottom layer 220A includes a polymeric material containing carbon, hydrogen, oxygen, nitrogen, and/or silicon. In the present embodiments, the bottom layer 220A includes silicon. While the specific composition of the bottom layer 220A is not limited, the bottom layer 220A as provided herein is patternable by a lithography process (discussed in detail below with respect to the photoresist layer 220B) and capable of providing etching selectivity with respect to a subsequently-formed photoresist layer 220B thereover, i.e., the composition of the bottom layer 220A is sufficiently different from the composition of the photoresist layer 220B, which is discussed below, to ensure one of the two layer can be etched at a greater rate with respect to the other layer. The bottom layer 220A may be formed over the seed layer 216 by any suitable method, such as spin coating.

Referring to FIG. 5B, the method 10 at block 14 then forms the photoresist layer 220B over the bottom layer 220A. In the present embodiments, the photoresist layer 220B includes a polymeric material containing at least carbon, hydrogen, oxygen, and/or nitrogen, and is formed by any suitable method such as spin coating. As discussed above, to ensure etching selectivity between the bottom layer 220A and the photoresist layer 220B, the composition of the photoresist layer 220B is selected to be different from that of the bottom layer 220A. For example, the bottom layer 220A may include a polymer that contains silicon (e.g., at least 30% of silicon by weight), while the photoresist layer 220B includes a polymer that is substantially free of silicon (e.g., containing less than about 1% of silicon by weight). In some embodiments, the photoresist layer 220B further includes photo-acid generators (PAGs), thermal-acid generators (TAGs), photo-base generators (PBGs), and/or other molecules configured to enhance photosensitivity of the photoresist layer 220B to a given radiation source. In the present embodiments, both the bottom layer 220A and the photoresist layer 220B (together referred to as the masking element 220) are configured to be patternable by the same lithography process. For example, the lithography process may include exposing the masking element 220 to a radiation source (e.g., extreme ultraviolet, or EUV, radiation) through a photomask, and developing the exposed masking element 220 to form a desired pattern in the masking element 220.

Now referring to FIG. 5C, the method 10 at block 14 alternatively forms only the photoresist layer 220B over the seed layer 216, thereby filling the opening 214. The composition of the photoresist layer 220B has been discussed in detail above with respect to FIG. 5B. In addition, in the absence of the bottom layer 220A, the composition of the photoresist layer 220B as applied to the depicted embodiment in FIG. 5C is not limited so long as it remains patternable by a radiation source.

Turning to FIGS. 1 and 6A-6D, the method 10 at block 16 forms an opening and undercut features at bottom portions of the opening in the masking element 220. Embodiment depicted in FIGS. 6A and 6B collectively corresponds to the embodiment depicted in FIGS. 5A and 5B, in which the masking element 220 includes the photoresist layer 220B formed over the bottom layer 220A, and embodiment depicted in FIGS. 6C and 6D collectively corresponds to the embodiment depicted in FIG. 5C, in which the masking element 220 includes only the photoresist layer 220B.

Figures 6A, 6B:
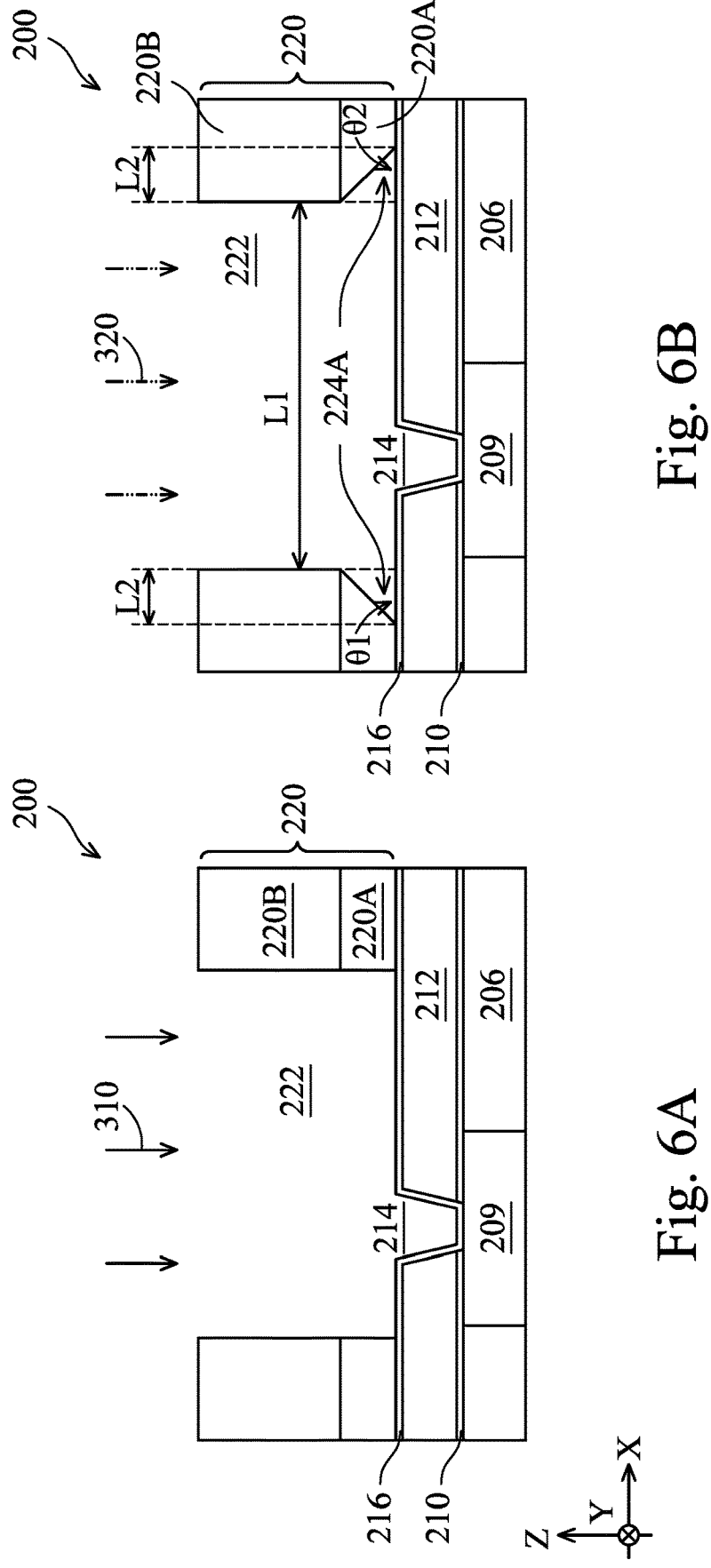

Referring to FIG. 6A, the method 10 at block 16 implements a patterning process 310 to the masking element 220, thereby forming an opening 222 and re-exposing the opening 214. In the present embodiments, the patterning process 310 removes portions of the masking element 220 (i.e., both the bottom layer 220A and the photoresist layer 220B) without removing, or substantially removing portions of the seed layer 216 or the first passivation layer 212. In the present embodiments, implementing the patterning process 310 includes exposing the masking element 220 to a radiation source (e.g., EUV) through a photomask and developing the exposed masking element 220 in a suitable solvent (i.e., developer) to form a patterned masking element 220. Depending upon the chemical reaction(s) between the masking element 220 and the solvent, exposed portions (in a positive photoresist scheme) or unexposed portions (in a negative photoresist scheme) of the masking element 220 may be removed to form the patterned masking element 220. The patterning process 310 may optionally include one or more baking process after performing the exposure process.

Continuing to FIG. 6B, the method 10 at block 16 implements an etching process 320 to the patterned masking element 220, forming undercut features 224A in a bottom portion of the bottom layer 220A as a result. In the present embodiments, due to the difference in composition between the bottom layer 220A and the photoresist layer 220B as discussed above, the etching process 320 removes portions of the bottom layer 220A at a greater rate than the photoresist layer 220B and the seed layer 216. In some embodiments, the etching process 320 does not remove, or substantially remove, any portion of the photoresist layer 220B and the seed layer 216. The etching process 320 may be any suitable etching process, such as a dry etching process, a wet etching process, reactive ion etching (RIE), or combinations thereof. In the present embodiments, the etching process 320 is a dry etching process implementing a fluorine-containing etchant, such as $CF_4$, $CH_3F$, $CHF_3$, other suitable fluorine-containing etchants, or combinations thereof.

In the present embodiments, a lateral dimension L2 of the resulting undercut features 224A is controlled by the duration of the etching process 320, which may be determined based on the etching rate of the photoresist layer 220B. In some examples, a ratio of L2 to a width L1 of the opening 222 may be about 1:30 to about 1:24. On one hand, a larger L2 may result in smaller angles θ1 and/or θ2 as labeled in FIG. 6B, leading to potential difficulty in filling the undercut features 224A during a subsequent plating process. On the other hand, a smaller L2 may result in larger angles θ1 and θ2, limiting the ability of the filled undercut features 224A (i.e., footing features 230B as discussed below and depicted in FIG. 9) to alleviate stress concentrating at corners of the subsequently-formed passivation layer (i.e., second passivation layer 240 discussed below and depicted in FIG. 9).

Figures 6C, 6D:
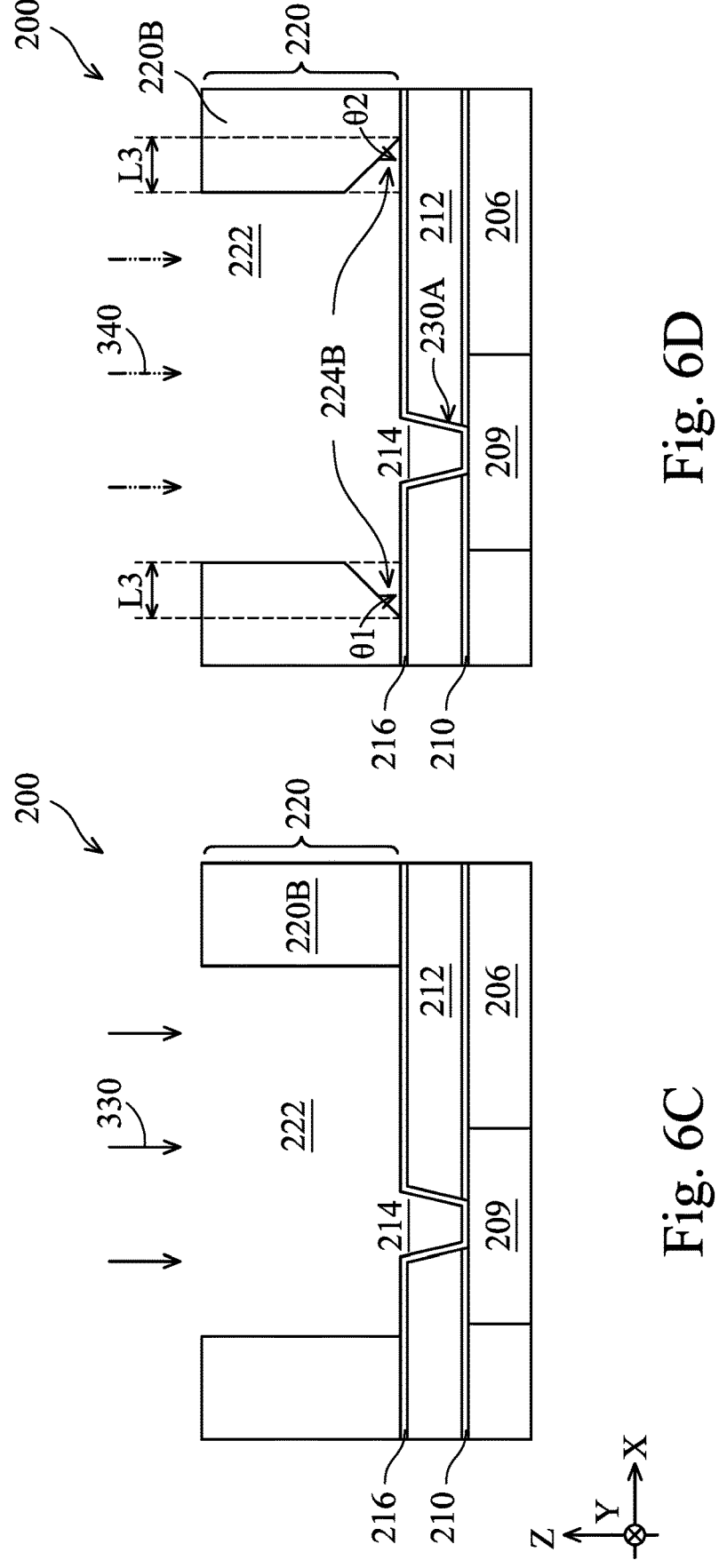

Now referring to FIGS. 6C and 6D, the method 10 at block 16 alternatively forms the opening 222 and undercut features 224B with a patterning process 330 and a de-focusing process 340 thereafter. Referring to FIG. 6C, the patterning process 330 may be a lithography process configured to remove a portion of the photoresist layer 220B via a series of exposure and development processes, thereby forming the opening 222 and re-exposing the opening 214. In some embodiments, the patterning process 330 is substantially similar to the patterning process 310 as discussed above. Notably, the patterning process 310 and the etching process 320 as discussed herein are implemented with different tools. In contrast, the de-focusing process 340 is implemented in the same lithography tool as the patterning process 330 but with different operating conditions from those of the patterning process 330.

Now turning to FIG. 6D, the method 10 implements the de-focusing process 340 to form the undercut feature 224B in the masking element 220 (i.e., the photoresist layer 220B). With respect to the patterning process 330, a beam of light (i.e., radiation source) is focused onto the masking element 220 through a photomask in order to form the opening 222 having a desired dimension. The focused beam ensures that sufficient energy is provided to initiate photochemical changes (i.e., chemical changes of the photoresist layer 220B caused by the light source) in the exposed masking element 220. The de-focusing process 340, however, involves deliberately diffusing or spreading the focal point of the beam, such that a portion of the photoresist layer 220B beyond what is exposed by the photomask may be exposed to the beam. As a result, de-focusing the beam causes bottom corners of the photoresist layer 220B to be over-exposed and, after being development, forms the undercut features 224B. In other words, different from the undercut features 224A, which are etched, the undercut features 224B are patterned directly in the masking element 220. Accordingly, a lateral dimension L3 of the undercut features 224B may be controlled by adjusting the extent to which the focal point of the beam is diffused, with a greater extent resulting in a greater magnitude of L3. In the present embodiments, the magnitude of L3 may be similar to that of L2, which has been discussed in detail above.

Regardless of whether the block 16 is implemented by the patterning process 310 and the etching process 320 or by the patterning process 330 and the de-focusing process 340, the undercut features 224A/224B as provided herein are configured to extend beyond vertical sidewalls of the opening 222 in a lateral direction (i.e., along the X axis in the depicted embodiments). Though depicted to be pointed corners, the present embodiments do not require corners the undercut features 224A/224B to be of specific shapes so long as they laterally extend outward from the sidewalls of the opening 222. In this regard, the corners may be blunt in some examples. Furthermore, it is not required that the angles θ1 and θ2 be equal in magnitude. The undercut features 224A/224B may be defined by angles θ1 and θ2 as discussed above, where the angles θ1 and θ2 are acute angles, i.e., measuring less than 90 degrees. In the present embodiments, the angles θ1 and θ2 is each about 30 degrees to about 70 degrees. Notably, if the angles θ1 and θ2 are less than about 30 degrees, it generally becomes difficult to ensure that the undercut features 224/224B are properly filled (e.g., not filled completely) during the subsequent plating process, resulting in defects in the subsequently-formed RDL. However, if the angles θ1 and θ2 are greater than about 70 degrees, the ability of the filled undercut features 224/224B (i.e., the footing features 230B) to mitigate stress concentration at corners of the RDL may be diminished.

Figures 7A, 7B:
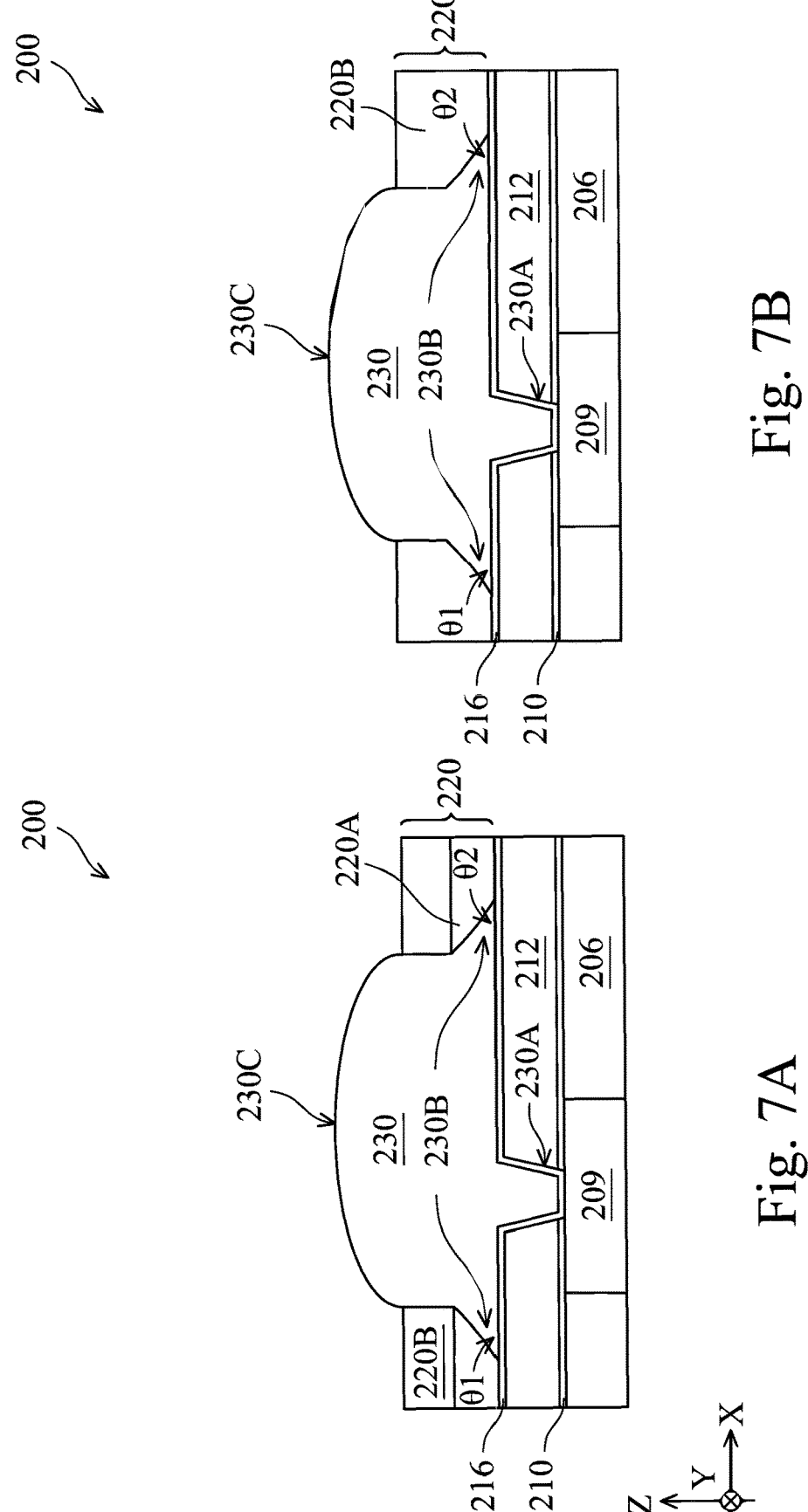
Figure 13:
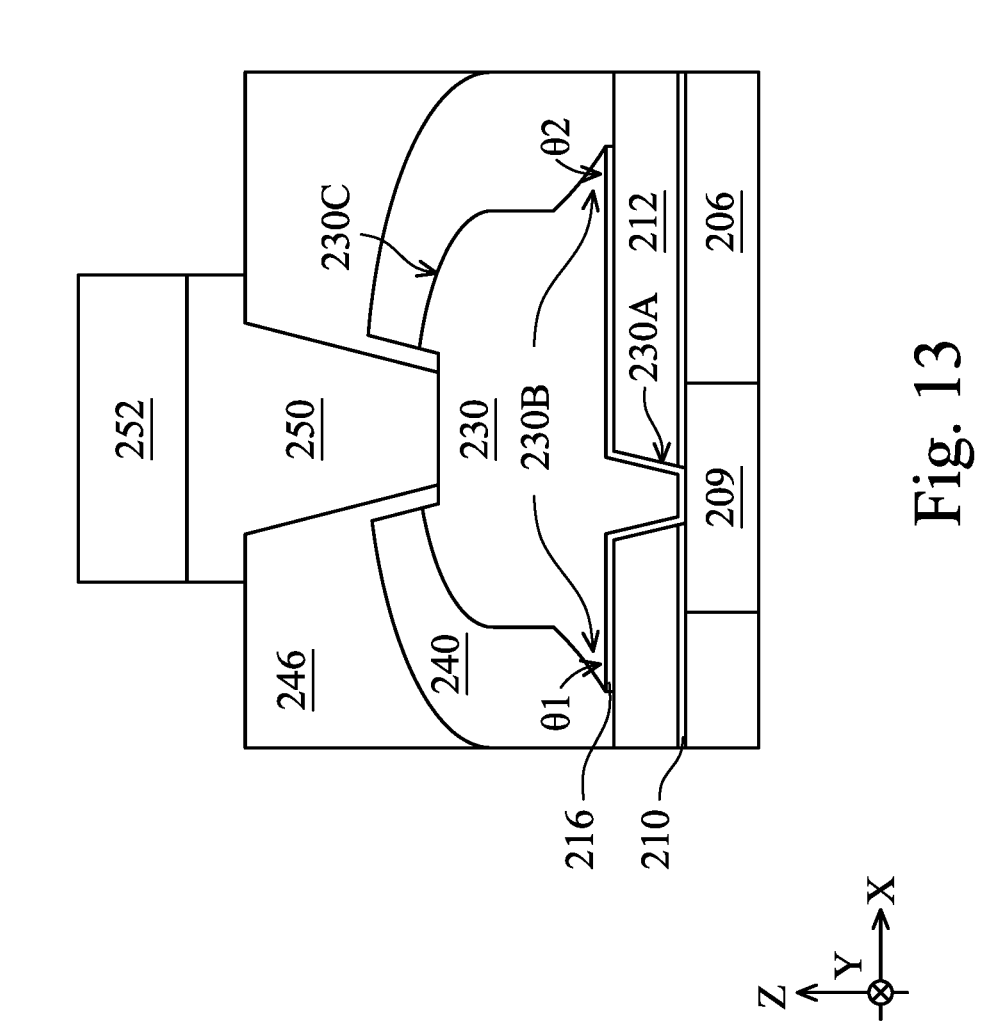

Now turning to FIGS. 1 and 7A-8, the method 10 at block 18 fills the openings (i.e., the opening 214, the opening 222, and the undercut features 224A/224B) of the patterned masking element 220 to form the RDL 230 over the passivation layer 212. The RDL 230 is configured to electrically connect the conductive line 209 with a subsequently-formed bump (e.g., bump 250 as depicted in FIGS. 13-14B). Although FIGS. 7A and 7B depict different embodiments of the present disclosure that proceed from FIGS. 6B and 6D, respectively, the process by which the RDL 230 is formed is substantially the same and will thus be discussed in terms general to both FIGS. 7A and 7B.

In the present embodiments, the RDL 230 includes elemental copper and is free of a copper-containing alloy. As provided herein, the RDL 230 is deposited by a plating process, such as electroplating and/or electroless plating, to fill the openings in the patterned masking element 220. In particular, the plating process may be implemented in a bottom-up scheme during which the RDL 230 grows on the seed layer 216 first and subsequently on itself rather than on a surface of the patterned masking element 220. Consequently, when the plating process is allowed to proceed uninhibited, the RDL 230 will continue to grow with its topmost portion rising above a top surface of the patterned masking element 220, a process discussed in detail below. In other words, a maximum height of the RDL 230 exceeds a depth of the opening 222. In some examples, wetting agents may be deposited before forming the RDL 230 to facilitate the bottom-up plating process. Though not depicted, a barrier layer may be formed over portions of the seed layer 216 exposed by the patterned masking element 220 before forming the RDL 230. The barrier layer may include titanium, titanium nitride, tantalum, tantalum nitride, tungsten, cobalt, cobalt nitride, tungsten nitride, ruthenium, ruthenium nitride, other metals, other metal nitrides, or combinations thereof.

Figure 8:
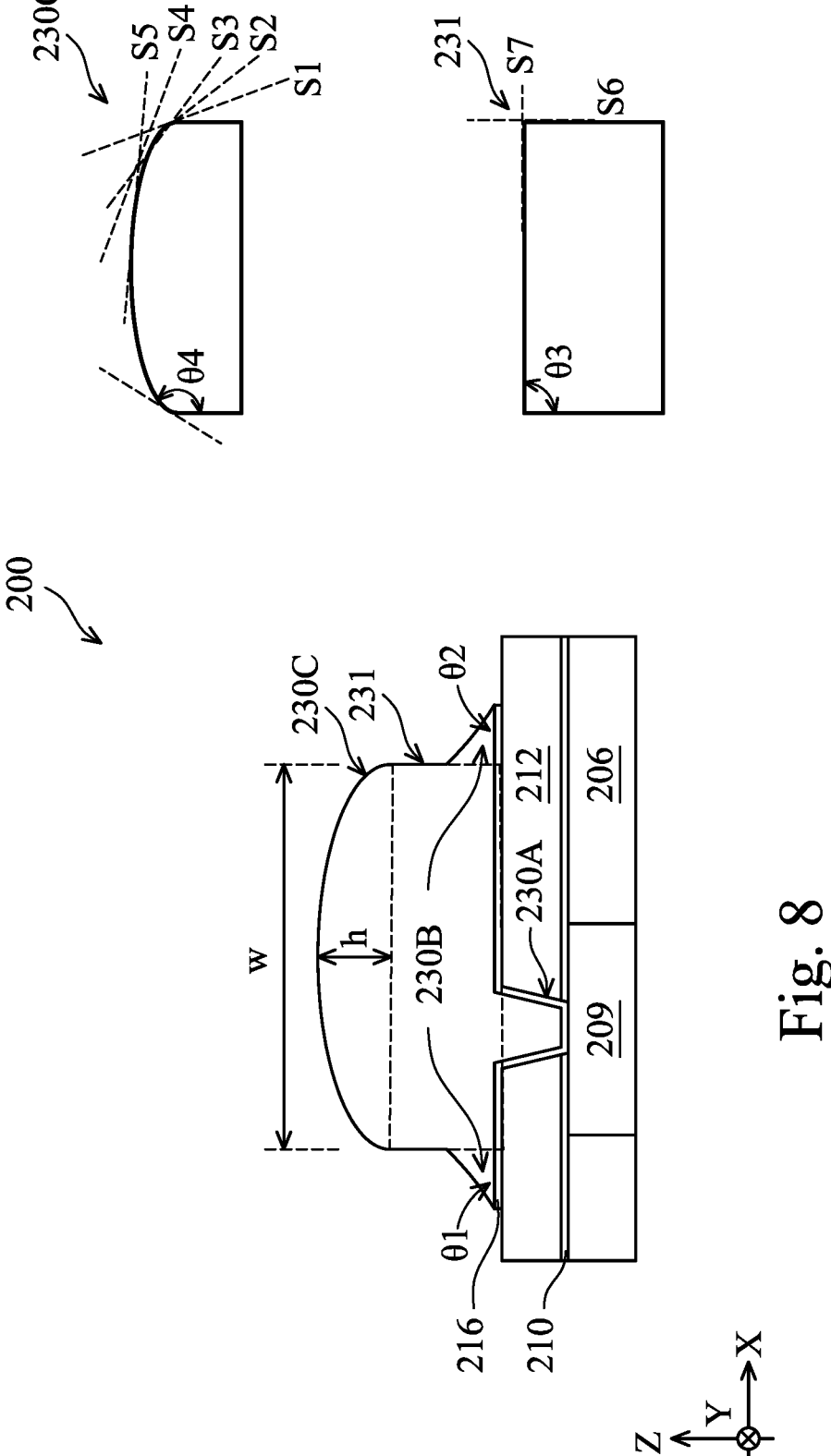

Thereafter, referring to FIG. 8, the patterned masking element 220 is removed from the workpiece 200 by any suitable method, such as resist stripping, wet etching, and/or plasma ashing. Subsequently, portions of the seed layer 216 not disposed under the RDL 230 are selectively removed from the workpiece 200 without removing, or substantially removing, portions of the RDL 230 or the first passivation layer 212. In one example, the etching process may be a dry etching process utilizing a fluorine-based etchant such as $SF_6$. Additionally or alternatively, the method 10 may implement a wet etching process utilizing a strong alkaline solution to remove any residual materials from the previous processing steps.

As depicted herein, the RDL 230 is made of a bottom portion 230A formed in the first passivation layer to contact the conductive line 209, footing features 230B formed in the undercut features 224, and a top portion 230C disposed above the seed layer 216 and between the vertical sidewalls of the RDL 230. In the present embodiments, the footing features 230B are defined by acute angles θ1 and θ2 due to shape of the undercut features 224A or 224B formed by the etching process 320 or the de-focusing process 340, respectively. In the present embodiments, the top portion 230C has a top surface (which is also the top surface of the RDL 230) that curves upward and away from the underlying components of the workpiece 200. In other words, the top surface and a sidewall of the RDL 230 meet at a rounded corner. The curved top surface may be defined by a ratio of a height h to a width w of the top portion 230C as depicted in FIG. 8. In the present embodiments, such ratio ranges from about 0.2 to about 0.3. On one hand, if the ratio is less than about 0.2, the resulting top portion 230C may be too flat, i.e., an angle θ4 (depicted in an enlarged view of the top portion 230C) defining an interior corner of the RDL 230 may approach or become 90 degrees. On the other hand, if the ratio is greater than about 0.3, the resulting top portion 230C may not yield sufficient contact area to engage with a subsequently-formed bump (e.g., bump 250 as depicted in FIGS. 13-14B).

Additionally, the curved top surface may be characterized by continuously changing slopes tangential to the curved surface. For example, as illustrated in the enlarged view of the top portion 230C, S1-S5 represent slopes of lines drawn tangentially at different points along the curved top surface. It is understood that the slopes S1-S5 gradually and continuously change in magnitude. For example, in the depicted embodiment, the slope gradually decreases from S1 to S5. In contrast, if the top portion 230C has a substantially flat top surface, referring to configuration 231 outlined by dotted lines in FIG. 8, which is also shown in an enlarged view, angle θ3 defining an interior angle of the configuration 231 is substantially orthogonal (i.e., approximately 90 degrees). This results in an abruptly, rather than gradually, changing slope from S6 (undefined due to a substantially vertical surface) to S7 (zero due to a substantially horizontal surface).

Typically, a flattening agent (containing, for example, benzene-based polymers) may be introduced toward the end of a plating process to ensure that a top surface of the resulting RDL 230 is substantially leveled (or planar) with the top surface of the patterned masking element 220, resulting in the configuration 231 having sharp corners (e.g., the angle θ3) as discussed above and depicted in FIG. 8. In other words, the flattening agent is configured to inhibit excess growth of the RDL 230 beyond the top surface of the patterned masking element 220. In these instances, the flattening agent inhibits growth of the copper layer by selectively adsorbing onto copper atoms (via electrostatic attraction) rather than the patterned masking element 220. Consequently, after forming a passivation layer (e.g., second passivation layer 240 discussed in detail below) over the RDL 230, any stress experienced by the passivation layer may concentrate at these orthogonal corners and result in structural defects including cracks, delamination, and/or other defects in the second passivation layer. In some instances, such stress may arise from uneven thermal expansion between the second passivation layer and a subsequently-formed protection layer (e.g., protection layer 246 as depicted in FIGS. 11-14B) thereover. To address these challenges, the present disclosure provides methods of forming an RDL free or substantially free of sharp corners (i.e., corners defined by substantially orthogonal angles, such as θ3) by forming the footing features 230B defined by acute angles (e.g., the angles θ1 and θ2) and by implementing the bottom-up plating process free of the influence of the flattening agent to form the curved top surface as discussed above. In other words, the plating process of the present embodiments is implemented deliberately without applying the flattening agent, such that the copper layer is allowed to grow uninhibited beyond the top surface of the patterned masking element 220.

Figures 9, 10:
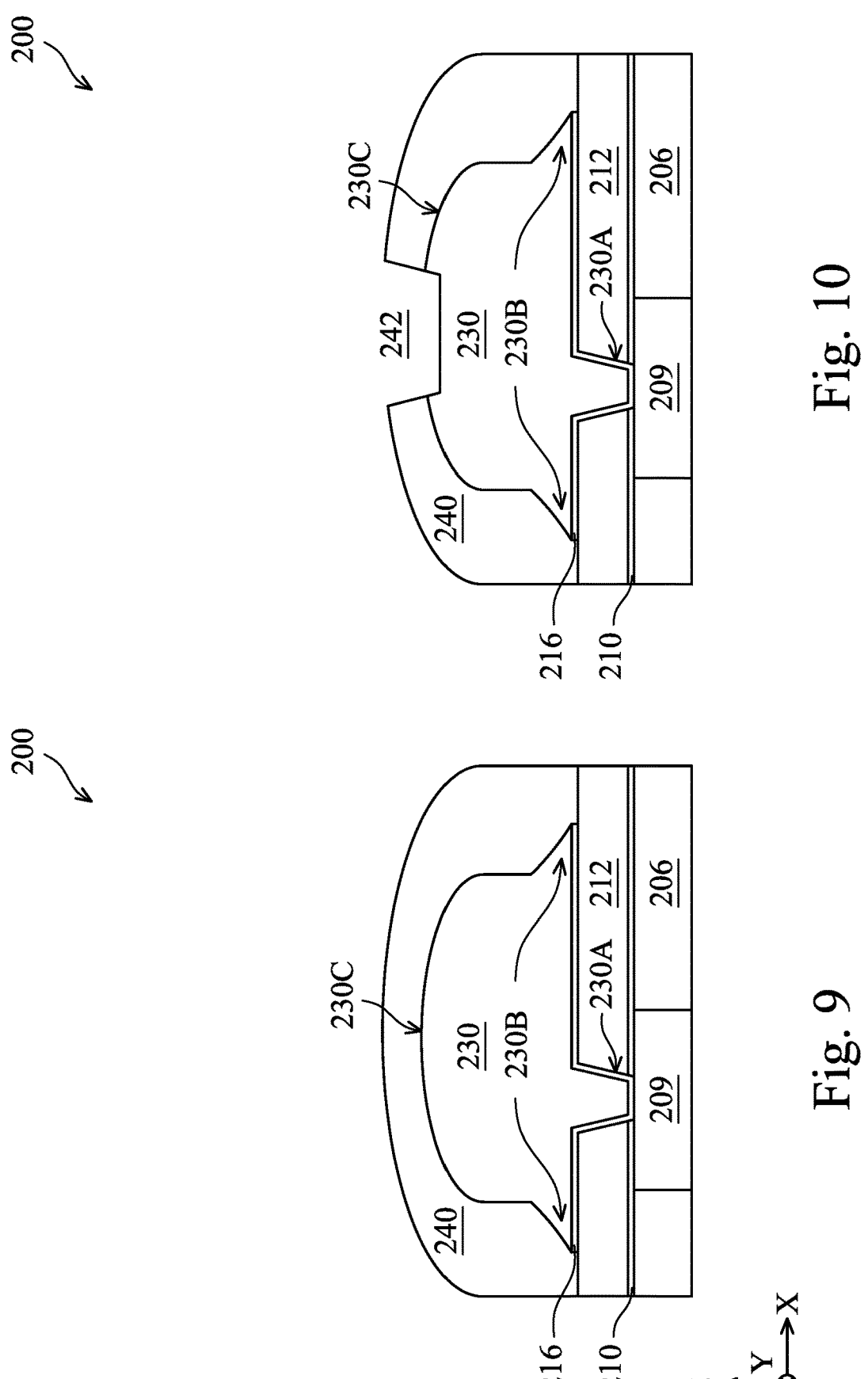

Referring now to FIGS. 1 and 9, the method 10 at block 20 forms the second passivation layer 240 over the RDL 230. The second passivation layer 240 may include silicon nitride, silicon oxide, other suitable dielectric materials, or combinations thereof. In some embodiments, the second passivation layer 240 includes a dense dielectric material configured to provide protection against contaminants (e.g., moisture and/or oxygen) into the RDL 230 and/or other components of the workpiece 200. In some embodiments, the composition of the second passivation layer 240 is different from the composition of the first passivation layer 212. For example, the first passivation layer 212 may include USG and the second passivation layer 240 may include silicon nitride. The second passivation layer 240 may have a single-layered structure or, alternatively, a multi-layered structure. The second passivation layer 240 may be formed by CVD, high-density plasma CVD (HDPCVD), plasma-enhanced CVD (PECVD), sub-atmospheric CVD (SACVD), other suitable methods, or combinations thereof. In the present embodiments, the RDL 230 is free of sharp corners at its interface with the second passivation layer 240, thereby alleviating stress concentrations between the RDL 230 and the second passivation layer 240 arising from any potential mismatched thermal expansion therebetween.

Referring now to FIGS. 1 and 10, the method 10 at block 22 forms an opening 242 in the second passivation layer 240 to expose a portion of the RDL 230. The opening 242 may be formed by a series of patterning and etching processes similar to those discussed above with respect to forming the opening 214 (FIG. 3). For example, a patterned masking element (not depicted) having an opening may be formed over the RDL 230 and a portion of the second passivation layer 240 exposed in the opening is subsequently removed by an etching process. In some embodiments, the etching process is a dry etching process implemented with an etchant such as $SF_6$. Additionally or alternatively, a wet clean process utilizing a strong alkaline solution may be performed to form the opening 242. In some instances, as depicted herein, the etching process at block 22 may remove a portion of the RDL 230, such that the opening 242 extends to below the top surface of the RDL 230.

Figures 11, 12:
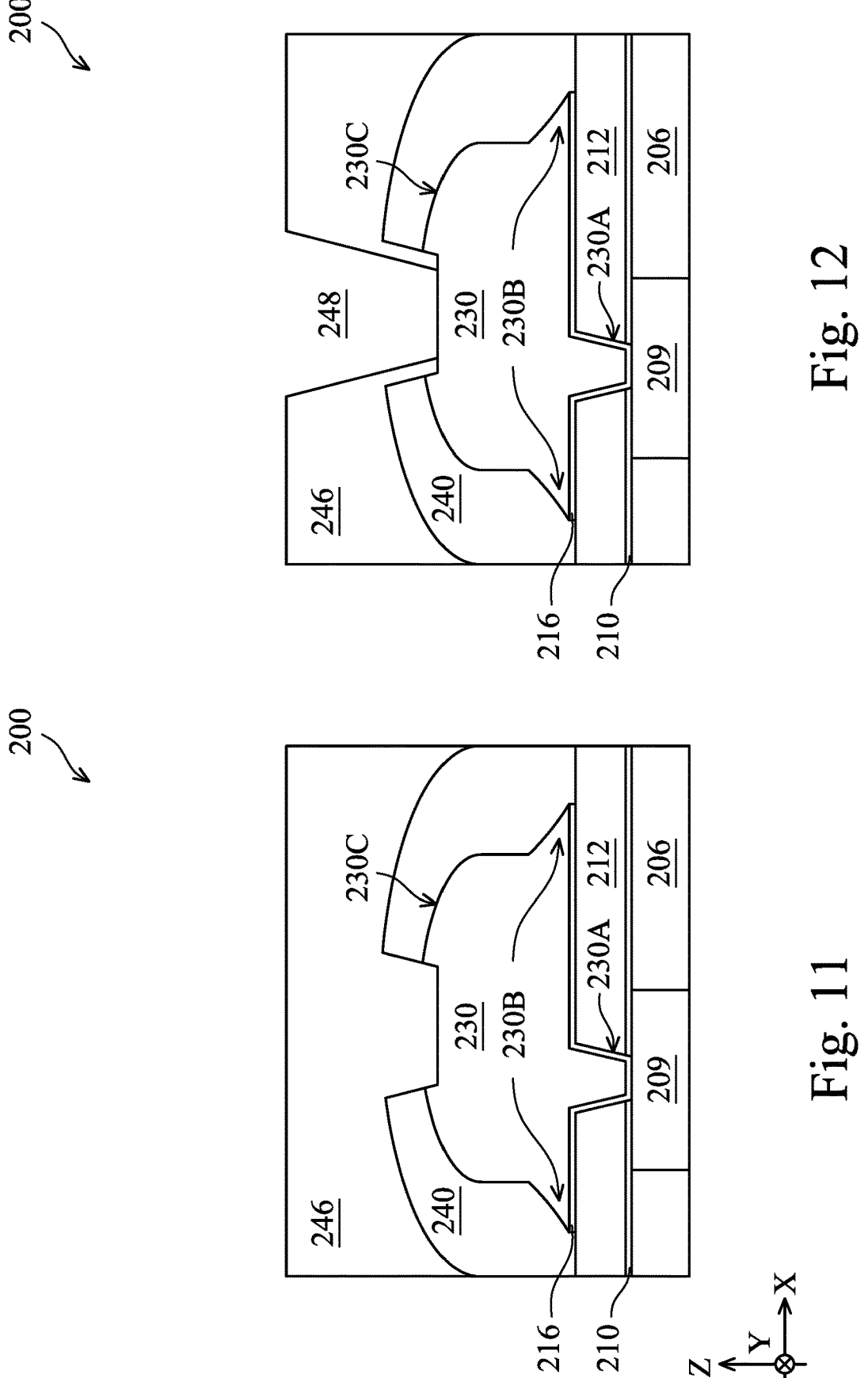

Referring to FIGS. 1 and 11, the method 10 at block 24 forms a protection layer 246 over the patterned second passivation layer 240, thereby filling the opening 242. The protection layer 246 may include polyimide, polybenzoxazole (PBO), benzocyclobutene (BCB), other suitable polymeric materials, or combinations thereof. In the present embodiments, the protection layer 246 includes polyimide, which is a photoresist material operable to undergo photochemical changes when exposed to a radiation source. In some embodiments, the protection layer 246 includes photosensitivity enhancers such as PAG, TAG, PBG, other suitable enhancers, or combinations thereof. In some embodiments, the protection layer 246 is formed by a suitable process such as spin coating. For embodiments in which the opening 242 extends to below the top surface of the RDL 230, a portion of the protection layer 246 may thus extend to below the top surface of the RDL 230.

Now referring to FIGS. 1 and 12, the method 10 at block 26 patterns the protection layer 246 to form an opening 248. For embodiments in which the protection layer 246 includes a photoresist material such as polyimide, the protection layer 246 may be directly patterned to form the opening 248. In other words, forming the opening 248 may be implemented by exposing the protection layer 246 to a radiation source through a photomask and subsequently developing the exposed protection layer 246 to form the opening 248. In the present embodiments, a width of the opening 248 is adjusted such that its sidewalls are defined only by the protection layer 246 rather than portions of the second passivation layer 240, i.e., the sidewalls of the opening 248 are lined with the protection layer 246. This is to ensure that the patterning process removes only the protection layer 246, which is photo-sensitive, rather than portions of the second passivation layer 240, which includes a dielectric material. In other words, leaving portions of the protection layer 246 in the opening 248 ensures that the resulting sidewalls have a substantially smooth profile. For embodiments in which the opening 242 extends to below the top surface of the RDL 230 (as depicted in FIG. 10), sidewalls of a bottom portion of the protection layer 246 contact both the second passivation layer 240 and the RDL 230.

After patterning, the protection layer 246 may be cured by baking or by exposure to a radiation source, such as UV light. In some embodiments, curing causes polymer chains of the protection layer 246 to cross-link, thereby forming a network that protects the underlying RDL 230 from mechanical stress arising from subsequent processing steps (e.g., bump forming process). However, curing may also cause the protection layer 246 to shrink as result of solvent evaporation or reduction reaction, thereby exerting compressive stress on the second passivation layer 240. If the second passivation layer 240 includes sharp corners at its interface with the RDL 230, compressive stress arising from the cured protection layer 246 will likely concentrate at such sharp corners, causing structural defects such as cracks, delamination, and/or other defects in the workpiece 200. The present embodiments remedy these structural defects by replacing the sharp corners with the curved top surface and the footing features 230B, thereby improving the structural integrity of the workpiece 200.

Now referring to FIGS. 1 and 13, the method 10 at block 28 forms a bump 250 in the opening 248. In the present embodiments, the bump 250 is configured to engage (i.e., electrically couple) with the portion of the RDL 230 exposed in the opening 248. In the present embodiments, the bump 250 includes a bulk conductive layer containing copper, nickel, cobalt, aluminum, gold, silver, palladium, tin, bismuth, their respective alloys, or combinations thereof. The bump 250 may optionally include a seed layer (not depicted) disposed under the bulk conductive layer in the opening 248 and configured to facilitate the formation of the bulk conductive layer. Depending upon the composition of the bulk conductive layer, the seed layer may include copper, tantalum, titanium, titanium nitride, tantalum nitride, other suitable materials, or combinations thereof. In an example embodiment, the bump 250 includes a copper-containing bulk conductive layer disposed over a copper-containing seed layer. For embodiments in which the opening 242 extends to below the top surface of the RDL 230, a portion of the bump 250 also extends to below the top surface of the RDL 230.

The bump 250 may be formed by a series of patterning and deposition processes. For example, forming the bump 250 may include forming a masking element (not depicted) including a photoresist layer over the protection layer 246, exposing the masking element to a radiation source through a photomask, developing the exposed masking element to form a patterned masking element that re-exposes at least the opening 248, then optionally depositing a seed layer in the opening 248, and forming the bulk conductive layer over the seed layer. As a result, the bump 250 is formed in portions of the workpiece 200 not covered by the patterned masking element. In some embodiments, the patterned masking element remains over the protection layer 246 until a solder layer (e.g., solder layer 252) is subsequently formed over the bump 250 as discussed below. The bulk conductive layer may be formed by a plating process (e.g., electroplating and/or electroless plating). In some embodiments, the plating process that forms the bump 250 is implemented with the flattening agent discussed above, such that a top surface of the bump 250 is substantially leveled.

Thereafter, a solder layer 252 may be deposited over the bump 250. The solder layer 252 may be a lead-based or a lead-free solder layer. In one example, the solder layer 252 may include lead and tin for a lead-based composition. In another example, the solder layer 252 may include an alloy containing indium and antimony or an alloy containing tin, silver, and copper, which may be referred to as SAC, for lead-free compositions. In further examples, varying compositions of a SAC alloy may be used, such as SAC 105 (tin 98.5%, silver 1.0%, copper 0.5%), SAC 305, and/or SAC 405. In some embodiments, the solder layer 252 includes eutectic materials that have a common melting point configured to form conductive solder connections in electrical applications. Solder layer 252 having a lead-free composition may be formed from tin and copper (and their respective alloys or compounds) without the use of silver. Alternatively, solder layer 252 having a lead-free composition may include tin and silver (and their respective alloys or compounds) without the use of copper. After forming the solder layer 252, the patterned masking element is removed by resist stripping, wet etching, and/or plasma ashing, resulting in the embodiment depicted in FIG. 13.

Thereafter, referring to FIGS. 14A and 14B, the method 10 at block 30 may anneal the workpiece 200 to allow the solder layer 252 to reflow over the bump 250 and form a reflowed solder layer 252'. The reflowed solder layer 252' may serve as a point of connection to external circuitry, such as another substrate, a printed circuit board (PCB), an interposer, a reconstituted wafer, an IC die, another redistribution layer, other interconnect structure, or other semiconductor device. The annealing process at block 30 may generate additional stress due to mismatch of CTEs between the protection layer 246 and the second passivation layer 240. Notably, the curved top surface and/or the footing features 230B of the RDL 230 provided herein alleviate such thermally induced stress, thereby preventing structural defects from damaging the second passivation layer 240.

In some embodiments, the bump 250 may be formed directly above the bottom portion 230A of the RDL 230 (not depicted), slightly overlapping with the bottom portion 230A along the X axis as depicted in FIG. 14A, or completely offset from the bottom portion 230A along the X axis as depicted in FIG. 14B. The present embodiments do not limit the configuration of the bump 250 with respect to the RDL 230 so long as the conductive line 209 and the bump 250 are electrically connected via the RDL 230 and that sufficient contact surface is provided between the bump 250 and the top portion 230C. Furthermore, referring to FIG. 14B, the angles θ1 and θ2 may be any acute angles and may not be equal in magnitude, depending upon the extent of the etching process 320 or the de-focusing process 340. Still further, as depicted in FIGS. 14A and 14B, the transition region from the vertical sidewall of the RDL 230 to the footing features 230B may be angular, as depicted by the solid outline of the RDL 230, curved, as depicted by the dotted outline, or step-like (not depicted). Regardless of the shape of the transition region, the angles θ1 and θ2 as defined herein are acute as discussed above.

Although not intended to be limiting, one or more embodiments of the present disclosure provide many benefits to a semiconductor device and the formation thereof. For example, embodiments of the present disclosure provide a copper-containing RDL that includes footing features and a curved top surface at interface with a passivation layer. In some embodiments, the footing features are formed by over-etching or by lithographic patterning to laterally extend an opening in which the RDL is subsequently formed. In some embodiments, the curved top surface is formed by implementing a bottom-up scheme when forming the RDL in the opening, such that the RDL over-grows to beyond a depth of the opening. In the present embodiments, the resulting RDL is substantially free of sharp corners (i.e., non-orthogonal angles) at its interfaces with one or more passivation layers, thereby mitigating structural defects at such interfaces caused by stress arising from, for example, mismatched thermal expansion of the passivation layer(s) and a polymeric protection layer formed thereover.

In one aspect, the present disclosure provides a method that includes providing an interconnect structure disposed over a semiconductor substrate, where the interconnect structure includes a metal line, forming a first dielectric layer over the metal line, patterning the first dielectric layer to expose a portion of the metal line in a first opening, and forming a pattern-forming layer over the first dielectric layer, thereby filling the first opening. The method further comprises subsequently forming a second opening in the pattern-forming layer, forming a footing profile to laterally extend the second opening, forming a redistribution layer (RDL) having a curved top surface in the second opening, such that the RDL is electrically coupled to the metal line, and forming a second dielectric layer over the RDL.

In another aspect, the present disclosure provides a semiconductor structure that includes an interconnect structure disposed over a semiconductor substrate, where the interconnect structure includes a metal line, a first dielectric layer disposed on the interconnect structure, an RDL disposed over the first dielectric layer, a second dielectric layer disposed over the RDL, a protection layer disposed over the second dielectric layer, and a conductive feature disposed in the protection layer and electrically coupled to the RDL. In the present embodiments, the RDL extends through the first dielectric layer to contact the conductive line. Furthermore, the present disclosure provides that the RDL includes a curved top surface and a footing profile disposed over a top surface of the first dielectric layer.

In yet another aspect, the present disclosure provides a semiconductor structure that includes a first passivation layer disposed over a metal line, a copper-containing RDL disposed over the first passivation layer, where the copper-containing RDL is electrically coupled to the metal line, and a second passivation layer disposed over the copper-containing RDL, where an interface between the second passivation layer and a top surface of the copper-containing RDL is curved. In the present embodiments, a portion of the copper-containing RDL in contact with a top surface of the first passivation layer forms an acute angle. In some embodiments, the semiconductor structure further includes a polymeric layer disposed over the second passivation layer, where a portion of the polymeric layer extends to contact the copper-containing RDL, a bump electrically coupled to the copper-containing RDL, and a solder layer disposed over the bump.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first dielectric layer over a metal line;
   a redistribution layer (RDL) penetrating through the first dielectric layer to land on the metal line, the RDL having a curved top surface, vertical side surfaces, and a footing feature, wherein the footing feature extends laterally from the vertical side surfaces of the RDL; and
   a second dielectric layer over the RDL, wherein the second dielectric layer also has a curved top surface.

2. The semiconductor structure of claim 1, further comprising a conductive seed layer between the RDL and the first dielectric layer and between the RDL and the metal line, wherein the conductive seed layer and the RDL include elemental copper and are substantially free of any copper-containing alloy.

3. The semiconductor structure of claim 1, the first dielectric layer is formed of an oxide material, and the second dielectric layer is formed of a nitride material.

4. The semiconductor structure of claim 1, further comprising:
   a protection layer disposed over the second dielectric layer; and
   a conductive feature penetrating through the protection layer to land on the RDL.

5. The semiconductor structure of claim 4, wherein the conductive feature is isolated from the second dielectric layer by the protection layer.

6. The semiconductor structure of claim 5, wherein the protection layer is formed of a different material than from the first and the second dielectric layers.

7. The semiconductor structure of claim 5, wherein the protection layer includes a polyimide.

8. The semiconductor structure of claim 4, wherein a bottom surface of the conductive feature is below the curved top surface of the RDL.

9. A semiconductor structure, comprising:
   a conductive line embedded in an inter-metal dielectric layer;

a first dielectric layer over the conductive line and over the inter-metal dielectric layer;

a redistribution layer (RDL) over the first dielectric layer and electrically connected to the conductive line, wherein the RDL includes a curved top surface;

a second dielectric layer over the first dielectric layer and over the RDL, wherein the second dielectric layer also includes a curved top surface; and a protective layer over the second dielectric layer, wherein the protective layer directly contacts inner side surfaces of the RDL and the second dielectric layer.

10. The semiconductor structure of claim 9, wherein the protective layer and the second dielectric layer are formed of different materials.

11. The semiconductor structure of claim 9, further comprising:

a conductive feature disposed over and electrically coupled to the RDL, wherein a bottom surface of the conductive feature is below the curved top surface of the RDL, wherein the conductive feature lands on a top surface of the protective layer.

12. The semiconductor structure of claim 9, wherein the RDL includes a footing profile disposed over a top surface of the first dielectric layer, wherein an angle defined by a slanted surface of the footing profile and the top surface of the first dielectric layer is between 30 to 90 degrees.

13. A method, comprising:

providing a metal line embedded in an inter-metal dielectric layer;

forming a first dielectric layer over the metal line;

patterning the first dielectric layer to expose a portion of the metal line in a first opening;

forming a pattern-forming layer over the first dielectric layer, thereby filling the first opening;

patterning the pattern-forming layer to form a second opening having vertical sidewalls;

forming a footing profile that laterally extends a bottom portion of the second opening; and forming a redistribution layer (RDL) in the second opening such that the RDL is electrically coupled to the metal line, wherein the forming of the RDL includes performing a bottom-up copper plating process such that elemental copper is grown above a top surface of the pattern-forming layer.

14. The method of claim 13, wherein the forming of the pattern-forming layer includes forming a photoresist layer filling the first opening, wherein the patterning of the pattern-forming layer includes performing a first lithography process with first operating conditions, wherein the forming of the footing profile includes performing a second lithography process with second operating conditions different from the first operating conditions.

15. The method of claim 14, wherein the first and the second lithography processes are performed in a same lithography tool.

16. The method of claim 14, wherein the second lithography process is a de-focusing process.

17. The method of claim 13, wherein the forming of the pattern-forming layer includes forming a first photoresist layer filling the first opening and forming a second photoresist layer over the first photoresist layer, wherein the patterning of the pattern-forming layer includes performing a lithography process to pattern both the first and the second photoresist layers, wherein the forming of the footing profile includes performing an etching process to selectively etch the first photoresist layer at a greater rate than the second photoresist layer.

18. The method of claim 17, wherein the first photoresist layer includes silicon and the second photoresist layer is substantially free of silicon.

19. The method of claim 18, wherein the elemental copper grown over the top surface of the pattern-forming layer forms a curved top surface of the RDL.

20. The method of claim 13, wherein the forming of the footing profile is performed in a separate etching or de-focusing process following the patterning of the pattern-forming layer.

* * * * *